(12) United States Patent
Cheng et al.

(10) Patent No.: US 9,006,054 B2
(45) Date of Patent: Apr. 14, 2015

(54) LATERAL DIODE COMPATIBLE WITH FINFET AND METHOD TO FABRICATE SAME

(71) Applicant: International Business Machines Corporation, Armonk, NY (US)

(72) Inventors: Kangguo Cheng, Schenectady, NY (US); Bruce B. Doris, Slingerlands, NY (US); Ali Khakifirooz, Mountain View, CA (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/916,689

(22) Filed: Jun. 13, 2013

(65) Prior Publication Data

US 2014/0367781 A1    Dec. 18, 2014

(51) Int. Cl.
*H01L 21/337*    (2006.01)
*H01L 21/84*    (2006.01)
*H01L 27/02*    (2006.01)

(52) U.S. Cl.
CPC .......... *H01L 27/0255* (2013.01); *H01L 21/845* (2013.01)

(58) Field of Classification Search
CPC ............ H01L 29/6609; H01L 29/66356; H01L 29/7391; H01L 29/861
USPC ............................................ 438/192
See application file for complete search history.

(56) References Cited

U.S. PATENT DOCUMENTS

| | | | |
|---|---|---|---|
| 6,429,482 B1 | 8/2002 | Culp et al. | |
| 6,670,255 B2 * | 12/2003 | Adkisson et al. | 438/343 |
| 6,750,109 B2 | 6/2004 | Culp et al. | |
| 6,967,363 B1 | 11/2005 | Buller | |
| 7,285,824 B2 | 10/2007 | Sumi et al. | |
| 7,888,775 B2 | 2/2011 | Russ et al. | |
| 2010/0142878 A1 * | 6/2010 | Park et al. | 385/2 |
| 2012/0032313 A1 | 2/2012 | Yamamoto et al. | |
| 2012/0256238 A1 * | 10/2012 | Ning et al. | 257/280 |
| 2013/0009215 A1 * | 1/2013 | Russ et al. | 257/263 |

FOREIGN PATENT DOCUMENTS

WO    2010115137 A1    10/2010

* cited by examiner

*Primary Examiner* — Jarrett Stark
*Assistant Examiner* — Mohammad M Hoque
(74) *Attorney, Agent, or Firm* — Harrington & Smith

(57) ABSTRACT

A method to fabricate a diode device includes providing a fin structure formed in a SOI layer. The fin structure has a sacrificial gate structure disposed on the fin structure between a first end of the fin structure and a second end of the fin structure. The method further includes depositing first doped semiconductor material on the first and second ends of the fin structure, where the first doped semiconductor material on the first end of the fin structure has one of the same doping polarity or an opposite doping polarity as the first doped semiconductor material on the second end of the fin structure. The method further includes removing the sacrificial gate structure to form a gap between the deposited first doped semiconductor material; depositing a second doped semiconductor material within the gap and forming first and second electrical contacts conductively connected to the first doped semiconductor material.

13 Claims, 6 Drawing Sheets

LATERAL DIODE COMPATIBLE WITH FINFET AND METHOD TO FABRICATE SAME

TECHNICAL FIELD

The exemplary embodiments of this invention relate generally to semiconductor devices and fabrication techniques and, more specifically, relate to the fabrication of semiconductor diode devices such as those used in logic and other types of circuitry.

BACKGROUND

In silicon on insulator (SOI) technology a thin silicon layer is formed over an insulating layer, such as silicon oxide, which in turn is formed over a bulk substrate. This insulating layer is often referred to as a buried oxide (BOX) layer or simply as a BOX.

Electrostatic discharge (ESD) protection devices can be implemented with diodes and are widely used with CMOS devices. In partially depleted SOI (PDSOI) devices lateral diodes are conventionally used. However, direct porting of such structures into FinFET technology that may employ extremely thin SOI (ETSOI) technology can result in poor performance as the diode area is limited to the fin cross-sectional area. In fact, with typical fin heights the diode area may be only about one half to one third that of a PDSOI diode.

One possible technique to increase the diode area is to use an undoped (or n-doped) epitaxial layer (e.g., 50-70 nm in thickness) that will "thicken" the diode so that the diode is capable of delivering a current comparable to a PDSOI lateral diode. However the use of this epitaxial 'thickening' technique can result in significant topography variations across the chip. Furthermore the use of this technique can require a specific set of junction formation implants that would be dedicated to the diode, i.e., the implant depth for the diodes would be different from the implant depth used in the FinFET region thereby complicating the chip fabrication procedure.

Clearly there is a need to provide a lateral diode device and structure that is compatible with conventional FinFET integration techniques.

SUMMARY

In a first aspect thereof the examples of the embodiments of this invention provide a method to fabricate a diode device. The method comprises providing a fin structure formed in a silicon-on-insulator (SOI) layer, the fin structure having a sacrificial gate structure disposed on and covering a portion of the fin structure between a first end of the fin structure and a second end of the fin structure. The method further includes depositing first doped semiconductor material on the first end of the fin structure and on the second end of the fin structure not covered by the sacrificial gate structure, the first doped semiconductor material on the first end of the fin structure having one of the same doping polarity or an opposite doping polarity as the first doped semiconductor material on the second end of the fin structure. The method further includes removing the sacrificial gate structure to form a gap between the deposited first doped semiconductor material on the first and the second ends of the fin structure; depositing a second doped semiconductor material within the gap; and forming a first electrical contact that is conductively connected to the first doped semiconductor material on the first end of the fin structure and a second electrical contact that is conductively connected to the first doped semiconductor material on the second end of the fin structure.

In another aspect thereof the exemplary embodiments of this invention provide a structure that comprises a fin having a first end and a second end and a substantially intrinsic portion en in an intermediate portion of the fin between the first end and the second end. The structure further comprises a first region of doped semiconductor material disposed on the first end of the fin and a second region of doped semiconductor material disposed on the second end of the fin. The first region of doped semiconductor material disposed on the first end of the fin has one of the same doping polarity or an opposite doping polarity as the second region of doped semiconductor material disposed on the second end of the fin. The structure further comprises a third region of doped semiconductor material disposed on the intermediate portion of the fin and adjacent to the first region of doped semiconductor material and the second region of doped semiconductor material, where the third region of doped semiconductor material having a doping polarity that differs from a doping polarity of at least one of the first region and the second region and forming a p-n junction with the at least one of the first region of doped semiconductor material and the second region of doped semiconductor material.

BRIEF DESCRIPTION OF THE SEVERAL VIEWS OF THE DRAWINGS

FIG. 1 is useful when explaining FIGS. 2 and 3 with regard to views through a fin and between fins.

DETAILED DESCRIPTION

The examples of the embodiments of this invention solve the foregoing and other problems. In a replacement metal gate (RMG) process flow a diode region is processed similarly to a FET region with the exception of sacrificial gate structure removal and fill. More specifically a sacrificial gate structure and spacers (that are used as well for FinFET devices on the same wafer) are removed from the diode area and the resulting gap is at least partially filled with at least one epitaxial (epi) layer. The result is that the diode effective cross section height is made at least about equal to the fin height plus the height of adjacent epitaxially deposited material. This enables, in the diode area, the achievement of a desired target diode thickness (e.g., >50 nm). With the exception of the epitaxy process used to fill the gap after the removal of the sacrificial gate structure and spacers the diode fabrication technique can share the same process steps employed for fabricating the FinFETs.

In the inventive process the fins are defined where ever needed for FinFETs and for diodes, and sacrificial gate structures and spacers are formed over the fins in both FET regions and diode regions. The FET regions and the diode regions can be intermixed across the surface of the wafer or they can be formed as separate areas/regions on the surface of the wafer. The fin geometry can be assumed to be the same for both the FinFETS and the diodes. The fabrication of both diodes and FinFETs can proceed simultaneously and in parallel for significant numbers of process steps with but a few deviations occurring that are specific to diode processing as will be explained below. In general different masks can be used for NFETs and for PFETs.

It is noted that while the embodiments of this invention are described in the context of a SOI substrate, at least some aspects of this invention can be employed as well with a bulk substrate.

Figure 1:
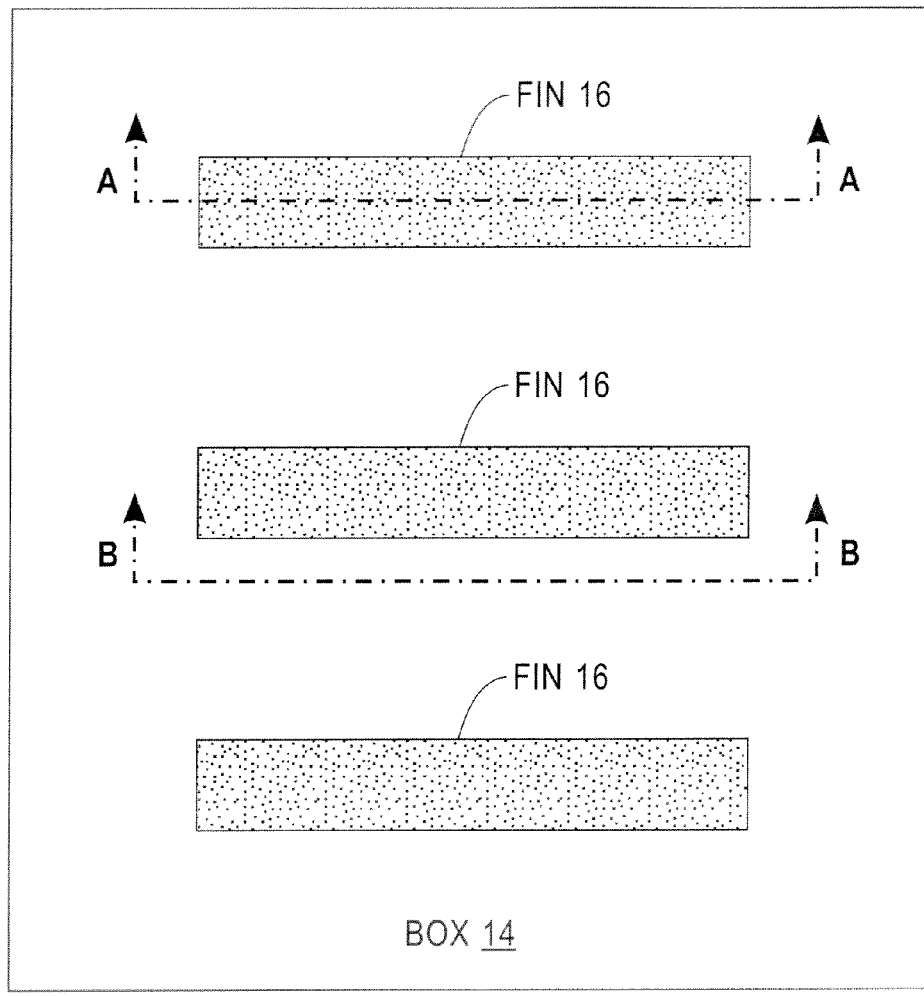
FIG. 1 is an enlarged top view showing a portion of a wafer having three fin structures disposed over a layer of buried oxide.

FIG. 1 is an enlarged top view showing a portion of a wafer 10 having as a non-limiting example three fin structures 16 disposed over a layer of buried oxide (BOX) 14. The fin structures 16 are formed by patterning and selectively removing an SOI layer that originally covers the BOX layer 14. The fins 16 can have a height in a range of, for example, about 5 nm or less to about 40 nm or more (depending on the thickness of the SOI layer) and a width in a range of, for example, about 5 nm to about 10 nm. The fin length will be some multiple (typically more than one) of the fin width.

Underlying the BOX 14 is a supporting substrate, such as a Si substrate 12 shown in FIGS. 2 and 3.

FIG. 1 is useful when explaining FIGS. 2 and 3 with regard to a view through a fin, designated by the cross-section line and arrows A, and a view between fins, designated by the line and arrows B.

First Embodiment

FIG. 2

Figure 2A:
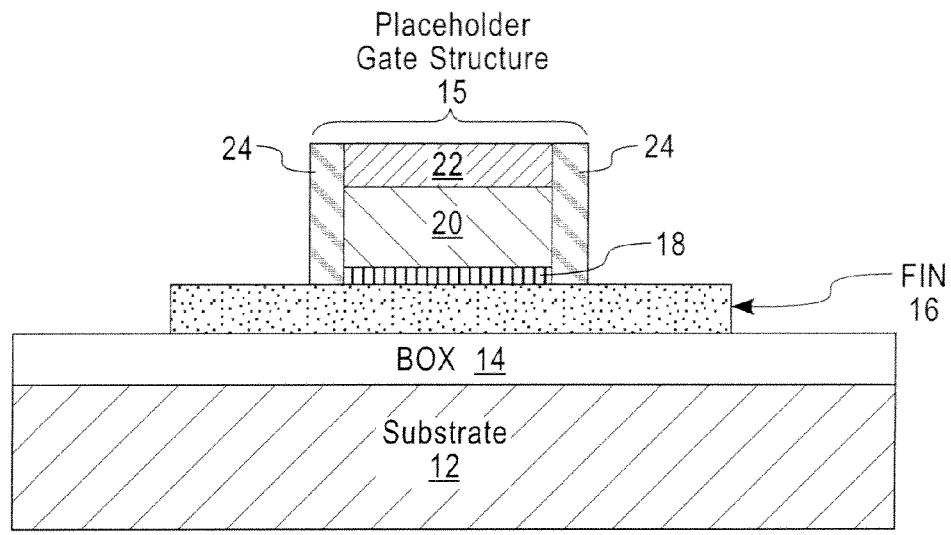
FIGS. 2A-2G, collectively referred to as FIG. 2, are enlarged cross-sectional views (not drawn to scale) that depict a series of processing steps in accordance with a first embodiment of this invention.

FIG. 2A shows the substrate 12, the overlying layer of BOX 14 and one of the fins 16 (in cross-section, i.e., the view is through the fin).) Disposed on the fin 16 is a sacrificial gate structure 15 comprised of a layer of sacrificial gate dielectric 18, a sacrificial gate electrode 20, a hardmask (HM) layer 22 and side wall spacers 24. As will become apparent all of these structures 18-24 are sacrificial structures that are removed during the RMG process. The illustrated fin 16 is one that will be processed to form a diode. Other ones of the fins 16 can be identical but will be processed instead to form transistors (FinFETs). In practice the sacrificial gate structure 15 will extend over the sidewalls of the fin 16. In a conventional FinFET that portion of the fin 16 beneath the gate functions as the transistor channel. The sacrificial gate structure 15 can be formed, for example, at least partially of polycrystalline (poly) silicon and can have a thickness in a range of about 25 nm to about 100 nm, or more preferably in a range of about 30 nm to about 70 nm, and a width in the range of about 15 nm to about 35 nm.

Figure 2B:
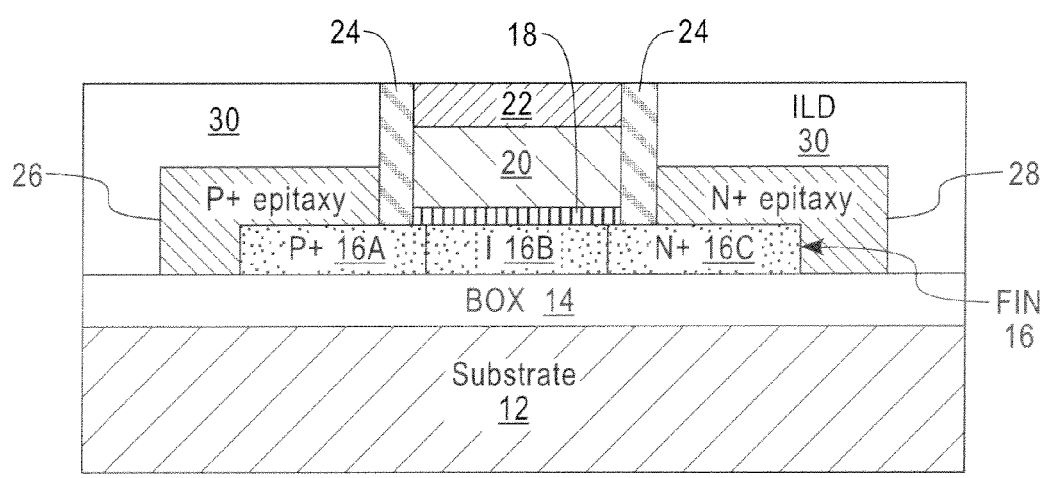

FIG. 2B shows that the two sides of the sacrificial gate structure 15 in the lateral diode region are doped to form p+ region 16A and n+ region 16C at the two opposing ends of the fin 16 not covered by the sacrificial gate structure 15.

In a most preferred embodiment of this invention p+ and n+ epitaxy structures 26, 28 are formed in a conventional manner by epitaxial growth on the two sides of the sacrificial gate structure 15. These epitaxy structures 26, 28 beneficially increase the fin cross-sectional area and current carrying capacity. In accordance with the most preferred embodiment of the present invention a junction anneal step, such as rapid thermal annealing (RTA) or laser spike annealing (LSA), can follow the merging and/or a less preferred ion implantation step to activate the source drain dopants. In this case dopant diffusion from the in-situ doped epitaxy structures 26, 28 can be used to form the doped regions 16A, 16C as opposed to using implants, or in conjunction with the implants (again the process can be shared by diodes and FETs). A layer of interlayer dielectric (ILD) 30, e.g., an oxide or a nitride, is then deposited and the structure is planarized.

In the most preferred embodiment of this invention the epitaxy structures 26, 28 can be in-situ doped and may have a dopant atom concentration in a range of about $1 \times 10^{20}$ to about $1.5 \times 10^{21}$ cm$^3$, for example, with about $4 \times 10^{20}$ to about $8 \times 10^{20}$ cm$^3$ being a preferred but non-limiting range of dopant concentration. The epitaxy structures 26, 28 are formed by the epitaxial growth of silicon, or Silicon Germanium such as by the use of a mixture of silane, dichlorosilane and germane gases with a chemical vapor deposition (CVD) process. The epitaxy structures 26, 28 can also be comprised of carbon-doped Si (Si:C) or SiGe. Phosphorus or Arsenic can each be considered as each one suitable n-type dopant, and Boron is one suitable p-type dopant.

While not a preferred embodiment, if an implant is used during the formation of the regions 16A and 16C the sacrificial gate structure 15 can act as an implant mask and the resulting implanted regions 16A, 16C can be considered as being self aligned with the sacrificial gate structure 15. The undoped portion of the fin 16 between the doped regions 16A and 16C can be considered as an intrinsic (I) region 16B.

In practice the formation of the in-situ doped epitaxy structures 26, 28 can be the preferred embodiment, with subsequent thermal diffusion of the dopants into the underlying ends 16A, 16C of the fin 16. During the formation of the in-situ doped epitaxy structures 26, 28 one end of the fin 16 is masked followed by the epitaxial growth of a first one of the epitaxy structures 26 or 28 on the opposite, unmasked end of the fin 16. The first mask is then stripped and a second mask is applied to cover the just deposited epitaxy 26 or 28 followed by the epitaxial growth of a second one of the epitaxy structures 26 or 28 on the opposite, unmasked end of the fin 16. The epitaxy structures 26, 28 can be formed in either order (n+ followed by p+ or p+ followed by n+).

Figure 2C:
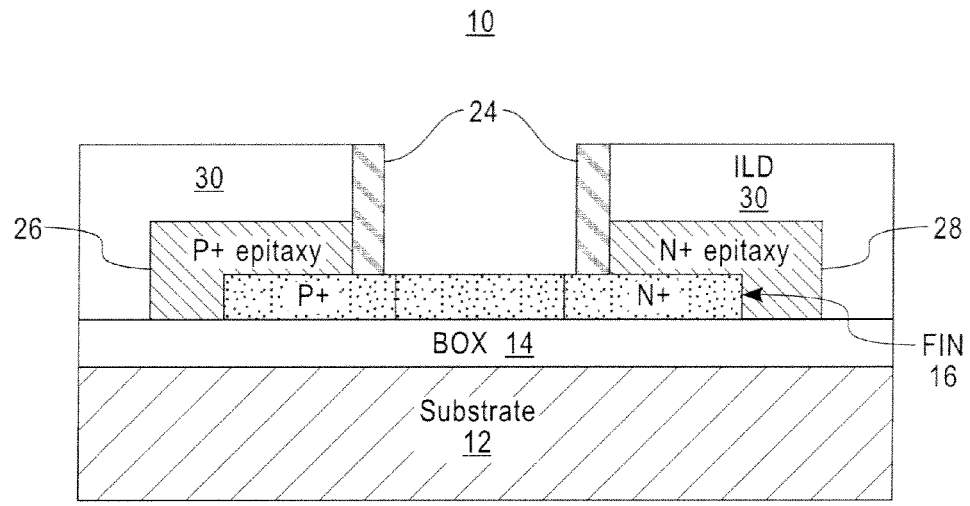
Figure 2D:
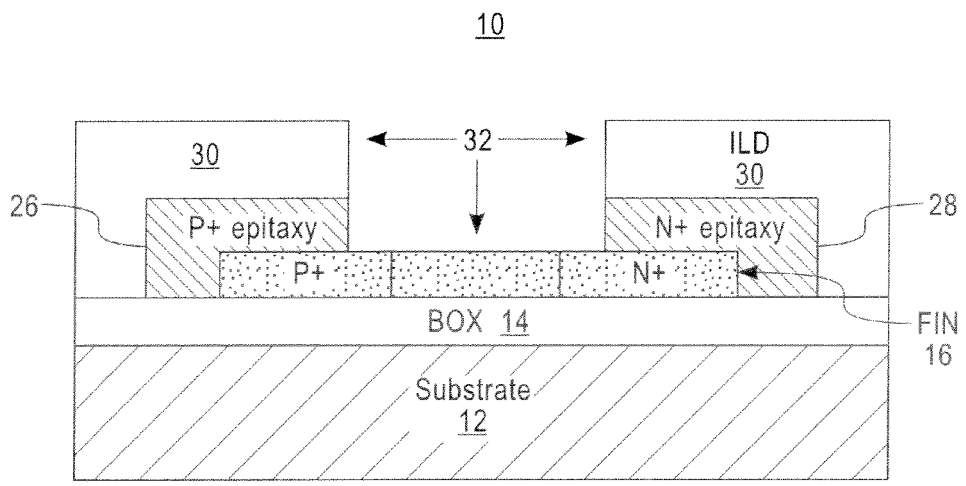

FIGS. 2C and 2D show the result of application of a mask to cover FinFET regions and expose only the diode region, followed by the removal of the sacrificial gate structure 15, i.e., the gate dielectric 18, the gate electrode 20 and the hardmask layer 22 from the diode region, followed by removal of the spacers 24. FIG. 2D shows the resultant aperture or opening or gap 32 in the diode region. Any suitable and conventional type of, e.g., reactive ion etch (RIE) and/or wet etch chemistry can be used to remove the sacrificial gate structure and form the gap 32.

Figure 2E:
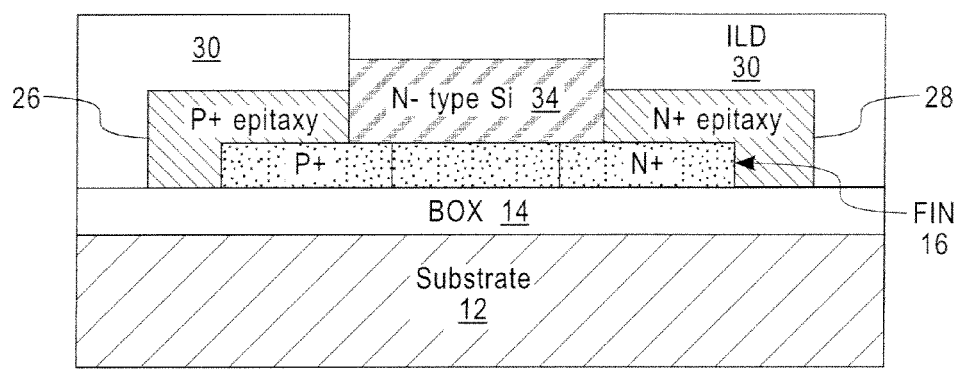

FIG. 2E is a cross-section view through the fin 16 and shows the gap 32 partially filled with an n-type Si epitaxy 34. The Si epitaxy 34 can be in-situ doped to the desired doping level, e.g., about $1 \times 10^{18}$/cm$^3$, or it can be implanted after epitaxy. An optional annealing process can be performed to diffuse the dopant into the fin 16 beneath the gap 32.

It can be noted that in practice the volume of the fin 16 occupies a relatively small portion (e.g., about 10% in some embodiments) of the diode cross-section. Thus, even if the preferred dopant diffusion process and/or the less preferred dopant implant process is not performed, and the fin 16 is left undoped or substantially undoped or not intentionally doped, the resulting performance of the diode is not appreciably degraded. That is, in some embodiments of this invention the doping of the ends of the fin 16, by either diffusion or implant or both, can be viewed as being optional.

Figure 2F:
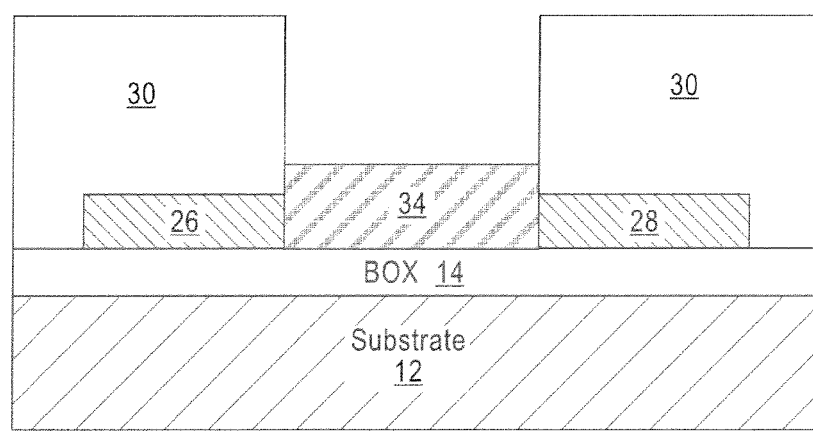

FIG. 2F is a view between the fins 16 at this point in the process flow. Note that the fin 16 is embedded within the epitaxy structures 26, 28 and the layer of Si epitaxy 34 that now fills a portion of the gap 32 left by removal of the sacrificial gate structure 15.

Figure 2G:
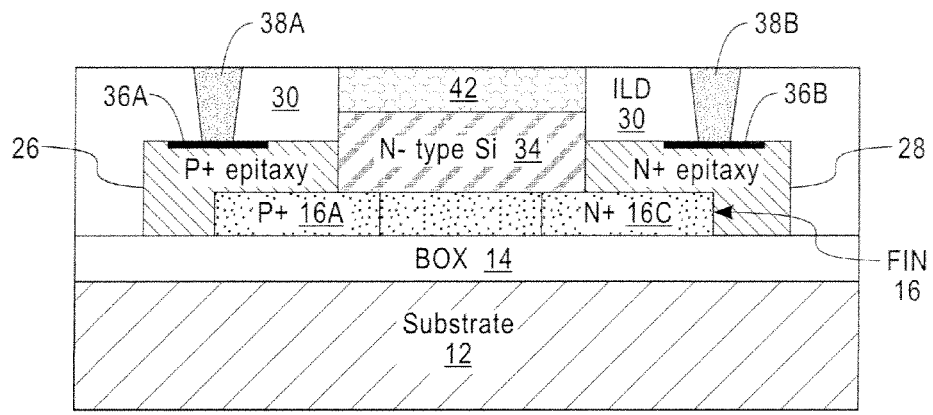

FIG. 2G is a cross-section view through the fin 16. At this step the remainder of the gap 32 can be filled with a dielectric 42 and processing continues as normal with removal of the sacrificial gate structures 15 in the FET regions and FET gate stack formation. During this process apertures are opened through the ILD and the exposed portions of the epitaxy structures 26, 28 silicided (36A, 36B, either trench silicide (TS) or silicide block) followed by the formation of contacts 38A, 38B. Note that if the remainder of the gap 32 is not filled with the dielectric 42 it will be filled with the gate dielectric and metal that is applied to the FETs. However, the presence of the gate dielectric and metal over the Si epitaxy 34 will not impair the functionality of the diode device.

In the completed two terminal diode device the n-type Si epitaxy 34 is electrically contiguous with n+ region 16C and the n+ epitaxy 28 of the epitaxy regions, and the p-n junction is thus formed at the interface of the p+ region 16A/p+ epitaxy 26 and the n-type Si epitaxy 34.

Second Embodiment

FIG. 3

In the second embodiment the two sides of the diode (both ends of the fin 16) are doped with the same doping polarity (as opposed to the first embodiment where two different doping polarities are used). FIG. 3 shows a non-limiting example where both sides of the diode are p+, alternatively the two sides can be made n+.

Figure 3A:
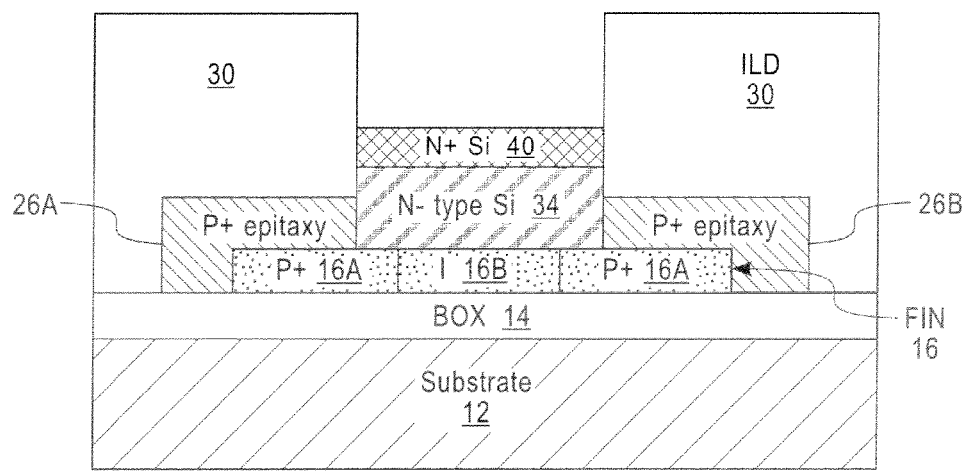
FIGS. 3A-3C, collectively referred to as FIG. 3, are enlarged cross-sectional views (not drawn to scale) that depict a series of processing steps in accordance with a second embodiment of this invention.

FIG. 3A is a view through the fin 16 at about the processing point shown in FIG. 2E for the first embodiment. Note that in this non-limiting embodiment the two ends of the fin 16 are both doped p+ (both ends designated as 16A) and that p+ epitaxy 26A, 26B is also located on both ends of the fin 16. In this embodiment the p+ epitaxy 26A, 26B can be formed in the same processing step, as opposed to the application and removal of the first and second masks and two epitaxial deposition steps as was described above for the embodiment of FIG. 2. In this embodiment, after ILD deposition and after the sacrificial gate and spacer 24 are removed, deposition of the n-type Silicon 34 layer (e.g., doping level about $1 \times 10^{18}/cm^3$) is followed by deposition over the n-type Silicon 34 layer of n+ epi 40 (e.g., doping level greater than about $1 \times 10^{20}/cm^3$).

Figure 3B:
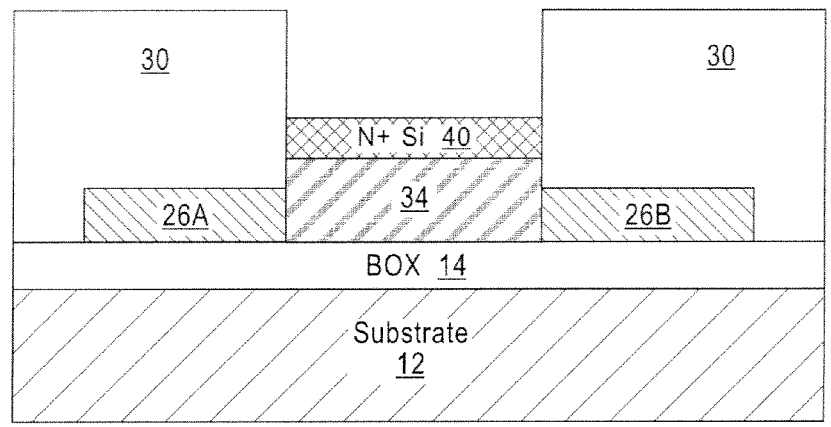

FIG. 3B is a view of the resultant structure taken between the fins.

Figure 3C:
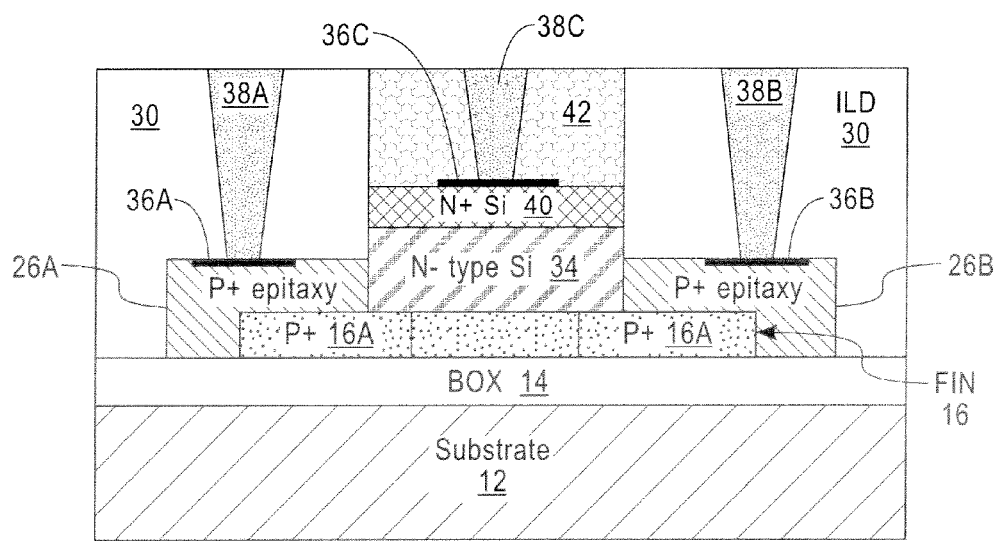

FIG. 3C is a cross-section view through the fin 16. At this step the remainder of the gap 32 above the n+ Silicon 40 can be filled with the dielectric 42 and processing continues as was described above in reference to FIG. 2G. Apertures can be opened through the ILD 30 and also through the dielectric layer 42 and the exposed portions of the p+ epitaxy 26A, 26B and the n+ Silicon 40 are silicided (36A, 36B, 36C, either trench silicide (TS) or silicide block) followed by the formation of contacts 38A, 38B and 38C.

In the completed three terminal diode device there are actually two p-n junctions that are formed at the interface of the n-type Silicon epitaxy 34 and the p+ regions 16A/p+ epitaxy 26A and 26B at both ends of the fin 16. Note that in practice the contact to the n+ Silicon epitaxy 40 can be made at the end of the device in a manner similar to a gate contact. That is, for simplicity the contact 38C to the n+ Silicon epitaxy 40 is shown to be co-planar and aligned with the contacts to the p+ epitaxy 26A, 26B, but in reality these contacts can be made at different locations.

In the alternate embodiment noted above the ends 16A of the fin 16 are both made n+, while the Silicon regions 34 and 40 are both made p-type.

It is pointed out that any one of FIGS. 2 and 3 can be seen to represent a structure such as an intermediate structure formed during the fabrication of a two or three terminal diode, such as an ESD diode for use on a chip containing one or more FETs, such as one or more FinFETS fabricated using SOI technology.

It can be appreciated that the embodiments of this invention do not require the use of a mask to define the first doping polarity and a second doping polarity on the two ends of the fin structure 16 (which could be the same polarity as in the embodiment of FIG. 3). In the various examples presented of the embodiments of this invention the spacing between the first and second doped regions (the ends of the fin 16) is not defined by a mask per se. Instead the first doped region is formed in the S/D regions of a FET-like structure by epitaxial growth and the second doped region is formed in the channel region of the FET-like structure by epitaxial growth after removing a sacrificial gate structure.

For this embodiment an additional mask is not needed in the process flow. The standard process flow can be used where one merges the fin in the source drain regions. Later the gate is removed and the diode structure is formed. For the first embodiment (FIG. 2) the additional mask is used since opposite dopings are made on the each side of the fin.

It can be further appreciated that in the embodiments of this invention the conduction path between the anode and cathode of the diode is not limited to only the fin cross-sectional area, which is significantly smaller than that of typical bulk diode devices. The use of the embodiments of this invention can provide a cross-section comparable to that of a bulk device but in the dimensional constraints associated with FinFET structures.

The embodiments of this invention thus provide a method and structure for forming integrated circuits in SOT that include diodes, where the diodes are processed at least partially in parallel with the processing of FinFETS.

It is to be understood that although the exemplary embodiments discussed above with reference to FIGS. 1-3 can be used in conjunction with common variants of the FET device including, e.g., FET devices with multi-fingered FIN and/or gate structures, FET devices of varying gate width and length, as well as ring oscillator devices. Moreover, transistor devices and diode devices can be connected to metalized pads or other devices by conventional ultra-large-scale integration (ULSI) metalization and lithographic techniques.

An integrated circuit in accordance with the present invention can be employed in applications, hardware, and/or electronic systems. Suitable hardware and systems in which such integrated circuits can be incorporated include, but are not limited to, personal computers, communication networks, electronic commerce systems, portable communications devices (e.g., cell phones), solid-state media storage devices, functional circuitry, etc. Systems and hardware incorporating such integrated circuits are considered part of this invention. Given the teachings of the invention provided herein, one of ordinary skill in the art will be able to contemplate other implementations and applications of the techniques of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

As such, various modifications and adaptations may become apparent to those skilled in the relevant arts in view of the foregoing description, when read in conjunction with the accompanying drawings and the appended claims. As but some examples, the use of other similar or equivalent semiconductor fabrication processes, including deposition processes, etching processes may be used by those skilled in the art. Further, the exemplary embodiments are not intended to be limited to only those materials, metals, insulators, dopants, dopant concentrations, layer thicknesses and the like that were specifically disclosed above. Any and all such and similar modifications of the teachings of this invention will still fall within the scope of this invention.

What is claimed is:

1. A method to fabricate a diode device, comprising:
providing a fin structure formed in a silicon-on-insulator (SOI) layer, the fin structure having a sacrificial gate structure disposed on and covering a portion of the fin structure between a first end of the fin structure and a second end of the fin structure;
depositing first doped semiconductor material on the first end of the fin structure and on the second end of the fin structure not covered by the sacrificial gate structure, the first doped semiconductor material on the first end of the fin structure having one of the same doping polarity or an opposite doping polarity as the first doped semiconductor material on the second end of the fin structure;
removing the sacrificial gate structure to form a gap between the deposited first doped semiconductor material on the first and the second ends of the fin structure;
depositing a second doped semiconductor material within the gap; and
forming a first electrical contact that is conductively connected to the first doped semiconductor material on the first end of the fin structure and a second electrical contact that is conductively connected to the first doped semiconductor material on the second end of the fin structure.

2. The method as in claim 1, further comprising doping first and second ends of the fin structure with a first dopant having a first polarity in the first end of the fin structure and with a second dopant having a second polarity in the second end of the fin structure.

3. The method as in claim 1, further comprising doping first and second ends of the fin structure with a dopant having a first polarity in the first end of the fin structure and with the dopant having the first polarity in the second end of the fin structure.

4. The method of claim 1, where depositing the first doped semiconductor material on the first and second ends of the fin structure not covered by the sacrificial gate structure comprises depositing semiconductor material containing a first dopant having a first polarity onto the first end of the fin structure and depositing semiconductor material containing a second dopant having a second polarity on to the second end of the fin structure.

5. The method of claim 4, further comprising diffusing the first dopant into the first end of the fin structure and diffusing the second dopant into the second end of the fin structure.

6. The method as in claim 4, where the second doped semiconductor material has a doping polarity that is the same as one of the first and second polarities.

7. The method of claim 1, where depositing the first doped semiconductor material on the first and second ends of the fin structure not covered by the sacrificial gate structure comprises depositing semiconductor material containing a dopant having a first polarity on to the first end of the fin structure and depositing semiconductor material containing the dopant having the first polarity on to the second end of the fin structure.

8. The method of claim 7, further comprising diffusing the dopant into the first end of the fin structure and diffusing the dopant into the second end of the fin structure.

9. The method as in claim 7, where the second doped semiconductor material has a doping polarity that differs from the first polarity.

10. The method as in claim 9, further comprising depositing a third doped semiconductor material on the second doped semiconductor material, the third doped semiconductor material having the same polarity as the second doped semiconductor material and a greater concentration of dopant than the dopant contained in the second doped semiconductor material.

11. The method of claim 10, further comprising forming a third electrical contact that is conductively connected to the third doped semiconductor material.

12. The method of claim 1, where at least the steps of providing the fin structure, depositing first doped semiconductor material on the first and second ends of the fin structure not covered by the sacrificial gate structure, and forming electrical contacts are performed in parallel with fabrication of a field effect transistor using a second fin structure also formed in the SOI layer, the second fin structure also having a sacrificial gate structure disposed on and covering a portion of the second fin structure.

13. The method of claim 1, where a portion of the fin structure between the first end of the fin structure and the second end of the fin structure is comprised of substantially intrinsic semiconductor material.

* * * * *